(12) United States Patent
Chan

(10) Patent No.: US 7,989,712 B2
(45) Date of Patent: Aug. 2, 2011

(54) ELECTRONIC PROTOTYPING ENCLOSURE

(76) Inventor: Eric K. D. Chan, Markham (CA)

( * ) Notice: Subject to any disclaimer, the term of this patent is extended or adjusted under 35 U.S.C. 154(b) by 291 days.

(21) Appl. No.: 12/455,071

(22) Filed: May 29, 2009

(65) Prior Publication Data

US 2010/0300747 A1  Dec. 2, 2010

(51) Int. Cl.
  *H01R 13/502* (2006.01)
(52) U.S. Cl. ........................... 174/562; 361/752
(58) Field of Classification Search .................. 174/561, 174/562, 59; 361/752
  See application file for complete search history.

(56) References Cited

U.S. PATENT DOCUMENTS

| | | | | |
|---|---|---|---|---|
| 5,057,648 | A | * | 10/1991 | Blough et al. ............... 174/561 |
| 5,289,345 | A | * | 2/1994 | Corradetti et al. ........... 361/752 |
| 7,189,921 | B2 | * | 3/2007 | Andresen et al. ............. 174/50 |
| 7,563,991 | B2 | * | 7/2009 | Twitchell et al. ............ 174/560 |
| 2005/0023022 | A1 | * | 2/2005 | Kriege et al. ............... 174/52.4 |
| 2006/0157274 | A1 | * | 7/2006 | Stark ........................... 174/564 |

* cited by examiner

*Primary Examiner* — Hung V Ngo
(74) *Attorney, Agent, or Firm* — David W. Wong

(57) ABSTRACT

The protective electronic prototyping enclosure is conveniently formed to accommodate various prototype electronic projects. Openings in the enclosure may be accurately formed and markings can be neatly and precisely formed by on a paper label printed by using the computer. Variable panels are provided for covering spaces between electrical components located adjacent to the side panels of the enclosure.

11 Claims, 10 Drawing Sheets

ELECTRONIC PROTOTYPING ENCLOSURE

BACKGROUND OF THE INVENTION

1. Field of the Invention

This invention relates to an enclosure for constructing prototype electrical and electronic devices.

2. Background Art

In the design of electrical and electronic circuits, particularly for circuit developers and students, commonly after the circuit design has been established, a prototype is built to test the operation and feasibility of the circuit design. The prototype not only must be functional to provide the required purposes, it must also be able to withstand various inadvertent mishaps in its handling during its construction with various electrical components, and changes of electrical components which may be required during its testing stage, as well as when submitting the prototype for evaluation by other people. In order to preserve the integrity of the circuit design, a secure protective project enclosure must be provided. Heretofore, rectangular plastic boxes are employed for fabricating prototype electrical and electronic devices. The rectangular plastic box normally consists of a simple rectangular plastic casing and a rectangular plastic top cover, or alternatively two U-shaped rectangular half shells engageable with one another as top and bottom half shells to form a rectangular box. Various openings must be cut by the prototype builder in the side, bottom and top panels of the box to accommodate the operating parts of various electrical components such as switches, connectors, power receptacles, rotary shafts of rheostats, and numerical or graphic displays, etc., which are commonly used in making an electrical circuit. These electrical components are usually mounted on a printed circuit board located inside the box. It has been very problematic in forming such openings in the various side, top and bottom panels of the plastic box since these openings are formed commonly by drilling, sawing, and cutting the plastic panels at the required locations; and the plastic panels can easily break or crack in the drilling, sawing and cutting processes. It is particularly problematic to carry out these processes with a relatively small size plastic box for use in enclosing a relatively small circuit design, because of the difficulties in retaining and mounting the small plastic box securely during the sawing, cutting and drilling processes. These processes are difficult and sometimes impossible to carry out due to the restricted space available for inserting the drill and/or the cutting tool inside a relatively small box. Moreover, in order to form any circular opening larger than the size of a standard drill bit, or in forming openings other than a circular shape, the opening must first be formed by marking the outline of the required opening on the plastic panel and then numerous holes are drilled along the outline, and then the area defined by the numerous holes is punched out to form the opening. The opening thus formed invariably has jagged edges. In order to refine the shape of the opening, the jagged edges must then be painstakingly filed down by hand to obtain the desirable smooth edges. Often the filing process would result in a rather ugly irregularly shaped opening which ultimately renders an inferior appearance in the prototype device.

Furthermore, when a printed circuit board is employed in fabricating the prototype circuit, the circuit board is normally mounted in a horizontal manner inside the lower casing with the control and display electrical components mounted on top of the printed circuit board. These components have rotary shafts and/or slidable handles which must extend outside of the top panel of the enclosure to facilitate their operations. Accordingly, openings must be formed at the exact locations in the top panel for this purpose. It is extremely difficult to determine and to mark on the top panel of the plastic box accurately at the exact locations for forming the openings for accommodating the rotary shaft and slidable handle of these control and display electrical components.

Furthermore, operation markings such as a scale must be provided adjacent to opening for the rotary shaft and the slidable handle of the control components to guide or indicate their operations. Such operation markings are also difficult to provide on the plastic surface. Normally, such markings are either provided on an adhesive label applied on the plastic surface and located adjacent to the openings, or alternatively the markings are inscribed directly on the plastic surface adjacent to the openings. Since an adhesive label can easily fall off due to the deterioration of the adhesive or it may be defaced, while inscriptions of markings are difficult and time consuming to make, or to engrave neatly on the plastic surface.

Also, due to the limited space available in the protective plastic box, many electrical components such as connectors, switches, connection jacks, are necessarily located along the narrow space between the printed circuit board and the side panels inside the box, and a plurality of electrical wiring must be employed for directly connecting between the connection terminals of these electrical components and the printed circuit board. The plurality of electrical wiring connections are time consuming to make, and the connections are unreliable due to the tendency of damaging the wiring or shorting of the connection terminals.

SUMMARY OF THE INVENTION

It is a principal object of the present invention to provide a protective box for fabricating a prototype electrical and electronic device in which openings can be accurately and readily formed without the use of powered tools.

It is another object of the present invention to provide a protective box for fabricating a prototype electrical and electronic device having variable side panels for enclosing the spaces between electrical components located in the inside areas adjacent to the side edge portions of the box.

It is another object of the present invention to provide a protective box for fabricating a prototype electrical and electronic device in which electrical components may be securely and readily located therein with a minimum number of electrical wiring connections.

It is another object of the present invention to provide a protective box for fabricating a prototype electrical and electronic device having a clear plastic top panel made of a plastic material in which openings of selected shaped can easily be formed with a puncher.

It is still another object of the present invention to provide a protective box for fabricating a prototype electrical and electronic device in which openings and labeling may be formed accurately and easily.

It is yet another object of the present invention to provide a protective box for fabricating a prototype electrical and electronic device in which a battery compartment is provided for installing several different standard types of batteries.

BRIEF DESCRIPTION OF THE DRAWINGS

Reference is hereby made to the accompanying drawings which form part of the specification of the present invention.

DETAILED DESCRIPTION OF THE PREFERRED EMBODIMENTS

Figure 1:
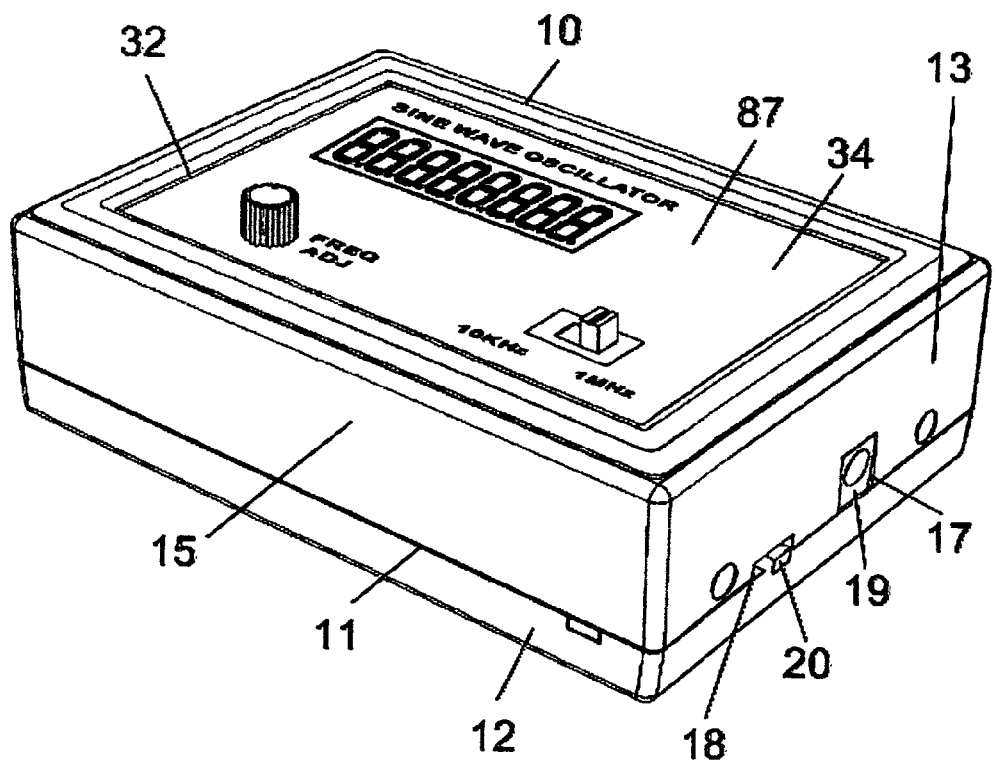
FIG. 1 is a perspective top front and side elevation view of the electronic prototype enclosure of the present invention.
Figure 2:
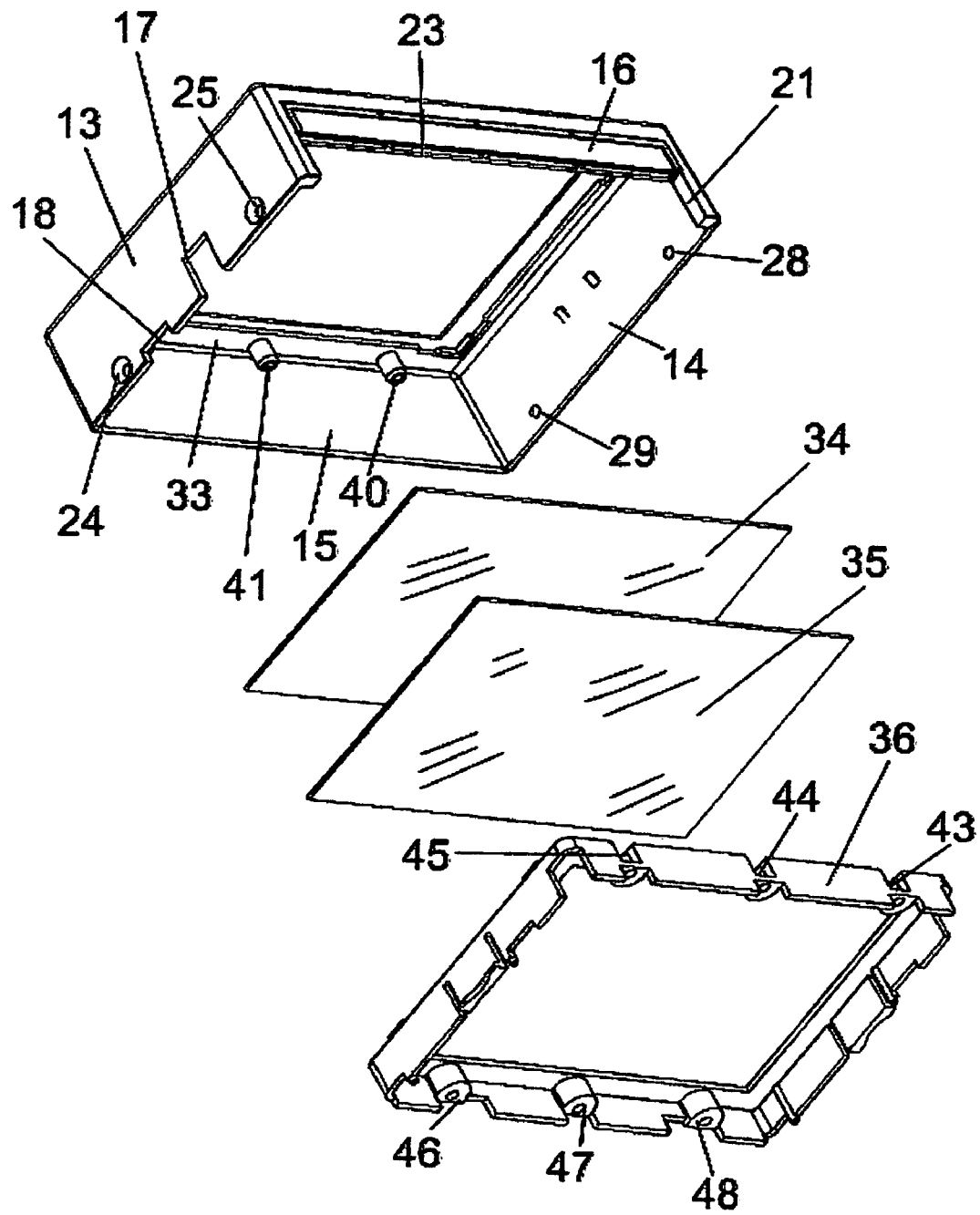
FIG. 2 is a bottom exploded view showing the component part of the top covering casing of the electronic prototype enclosure of the present invention.
Figure 3:
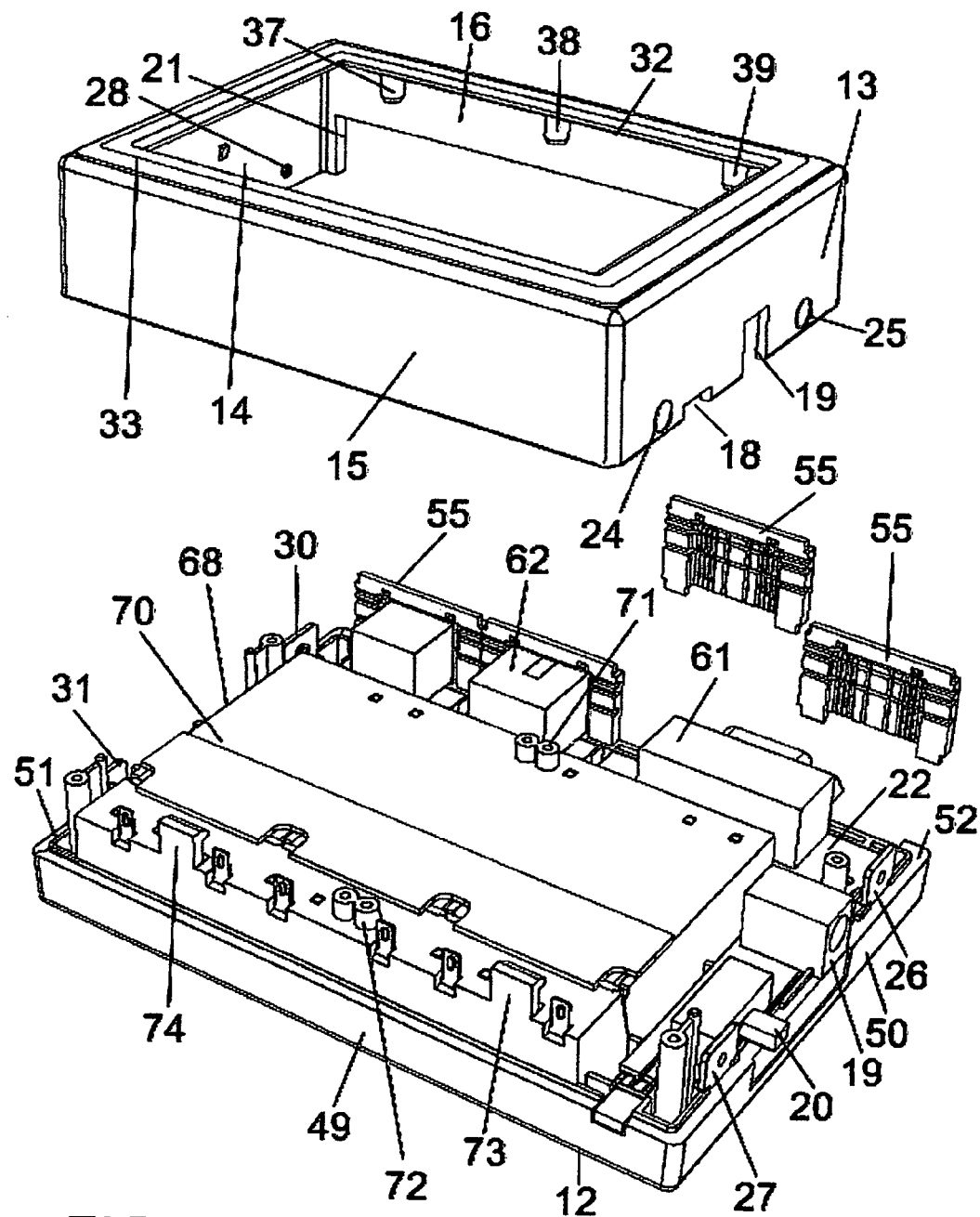
FIG. 3 is an exploded top front and side elevation view with the top cover casing and the lower support base separated from one anther.
Figure 4:
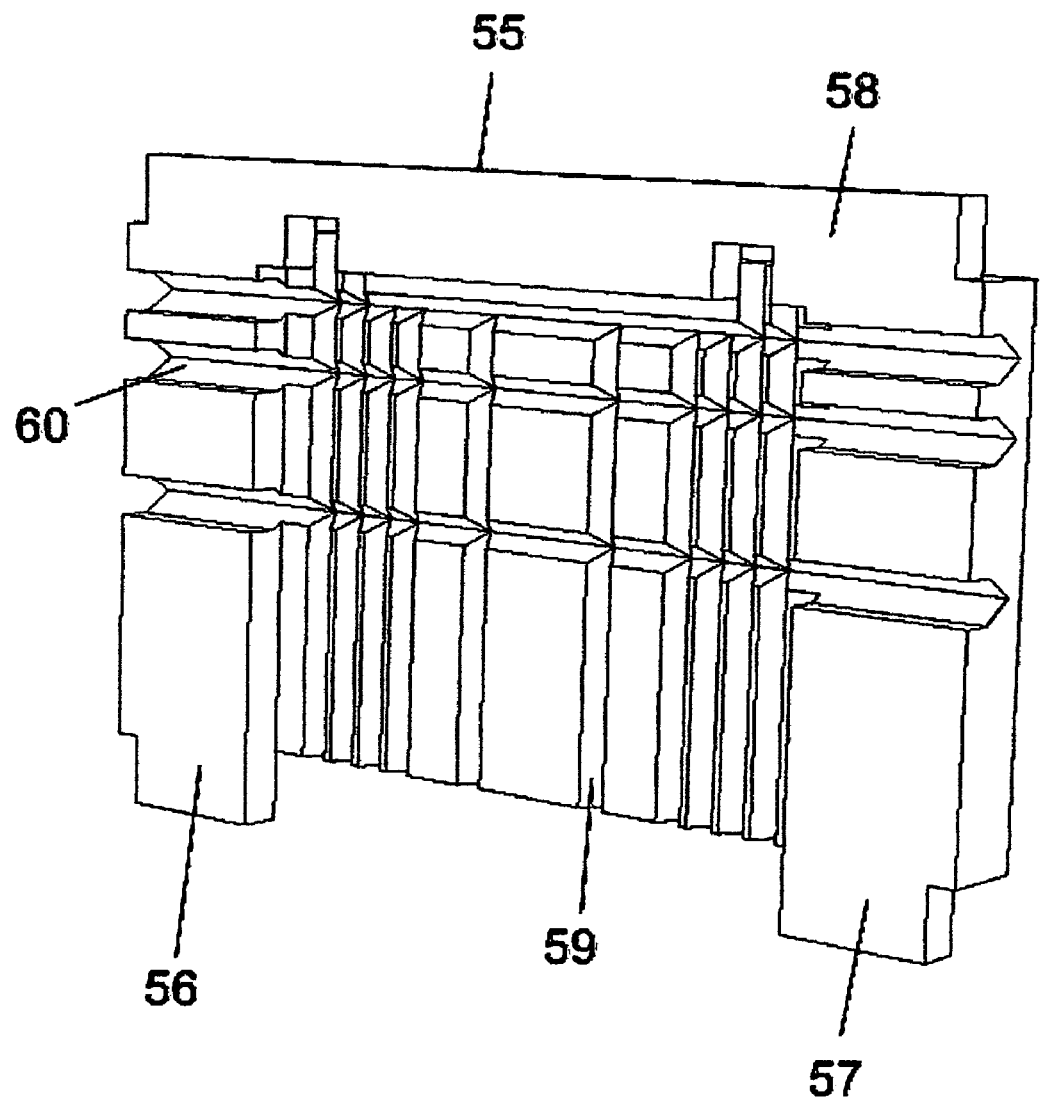
FIG. 4 is a perspective rear elevation view of the variable cover plate for covering space openings in the rear panel of the prototype enclosure of the present invention.

With reference to the drawings in which like reference numerals in the various views designate corresponding parts, the enclosure 10 of the present invention, consists of a top cover casing 11 and a lower support base 12 which are engageable with one another to form the enclosure 10. The top cover casing 11 has downwardly extending skirting side walls 13, 14, 15, and 16. The side wall 13 may be provided with pre-formed cut-outs 17 and 18 for accommodating electrical components such as connection socket 19 and a power switch 20 mounted in the right edge area of the lower support base 12. An elongated cut-out 21 is formed in the lower portion of the side wall 16 in order that electrical components may be located in the edge area 22 in the lower support base 12. A groove 23 is formed in the lower edge of the side wall 16. Mounting openings 24 and 25 may also be formed in the right side wall 13 for receiving mounting screws (not shown) for securing the top cover casing 11 to the lower support base 12 with threaded plates 26 and 27 provided in the right side of the lower support base 12. Similar mounting openings 28 and 29, shown in FIG. 2, may also be provided in the left side wall 14 of the top cover casing for the same purposes with screws engaging with threaded mounting plates 30 and 31 respectively provided in the left side of the lower support base 12. Alternatively, flexible tabs instead of plates 26, 27, 30 and 31 may be provided at the lower support base 12 which would snappingly engage with depressions formed in the inner side wall of the 13 and 14 to secure the top cover casing and the lower support base together.

A large rectangular opening 32 is formed in the top of the top cover casing 11. The rectangular opening 32 is bounded by a rectangular border frame 33. Two transparent protective cover sheets 34 and 35 are located within the top cover 11 to rest against the rectangular border frame 33, and it may be retained in place with a rectangular mounting frame 36 mounted to posts 37, 38, 39, 40, 41, and 42 provided in the top cover casing 11. The rectangular mounting frame 36 is provided with closed end slots 43, 44, 45, 46, 47, and 48 having an opening formed in the closed end. The rectangular frame 36 is locatable within the top cover casing 11 with the closed end slots engaging with the posts 37, 38, 39, 40, 41 and 42 such that the rectangular mounting frame 36 may be secured to the inside of the top cover casing 11 with screws (not shown) for holding the cover sheets 34 and 35 under the rectangular border frame 33. The cover sheets 34 and 35 may be provided by two thin clear PVC sheets such that openings of selected shapes may be easily made in the cover sheets 34 and 35 with a simple punching hand tool. Furthermore, locations for punching the openings may be accurately marked on a paper template such as with print out provided by a computer design, and the template is sandwiched between the cover sheets 34 and 35 to facilitate the formation of the openings precisely. Also, the formation of the openings on the cover sheets 34 and 35 with the punching hand tool may be carried out easily with the cover sheets separate from the top cover 11, and errors in the formation of the openings may be quickly and simply corrected by replacing the cover sheets.

Figure 5:
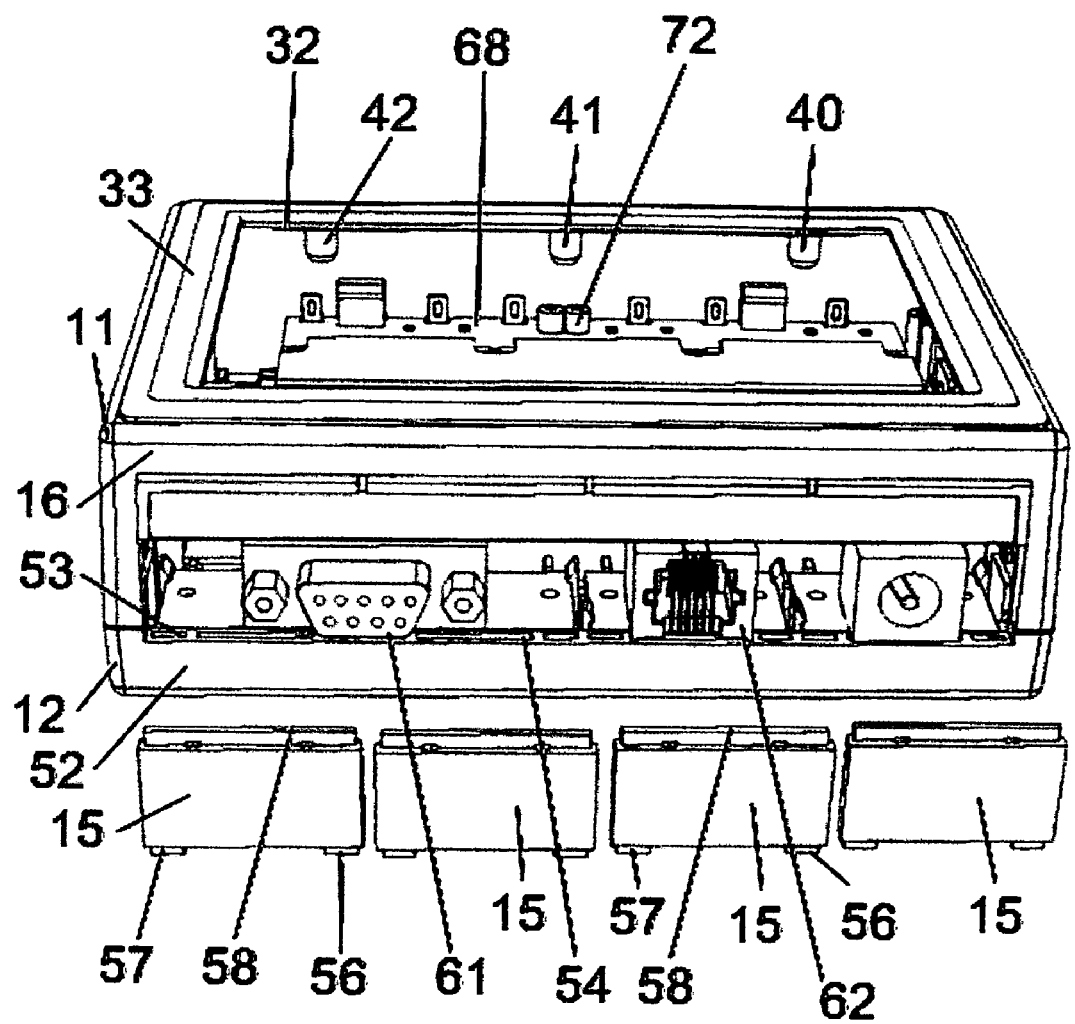
FIG. 5 is a perspective top and rear elevation view of the electronic prototype enclosure of the present invention with the top cover sheet removed and the variable cover plates separated from the rear of the enclosure.
Figure 6:
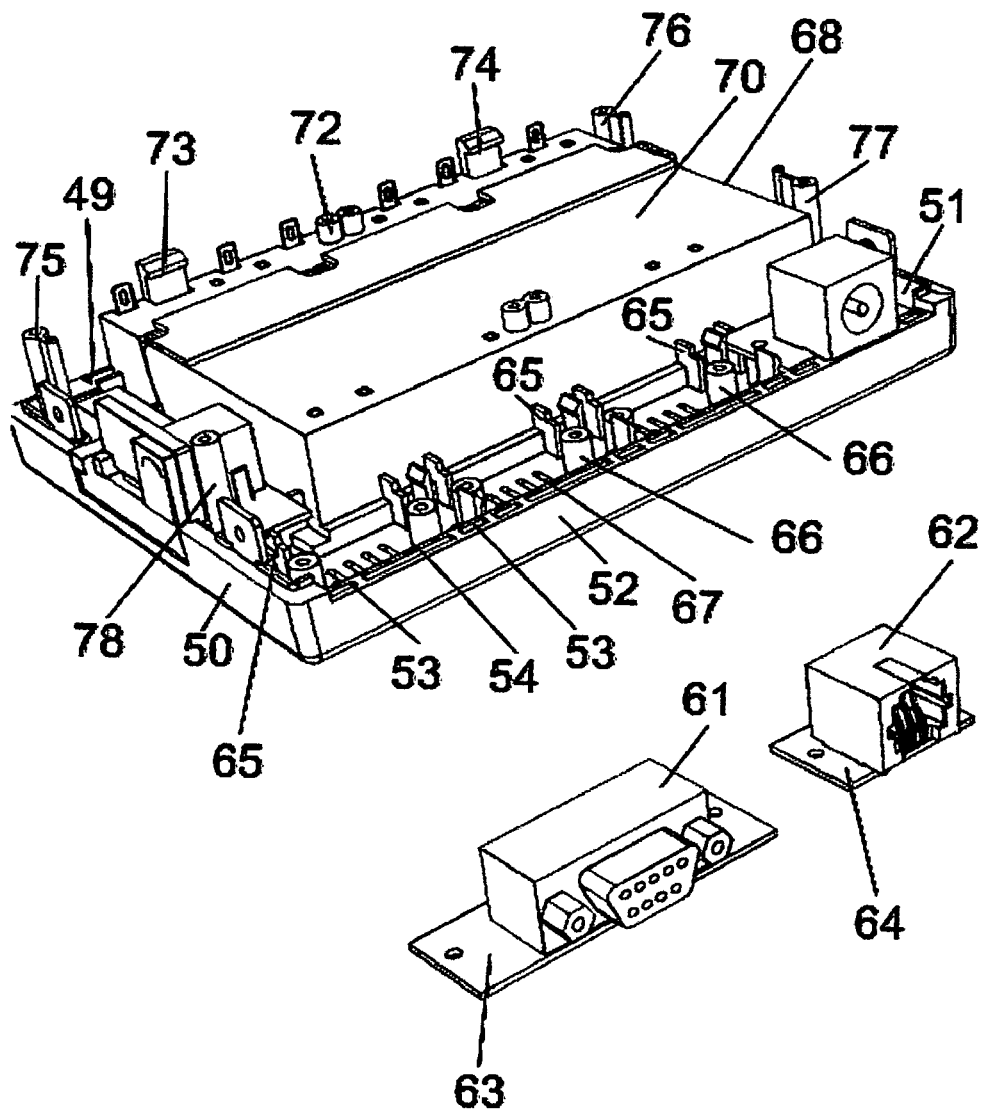
FIG. 6 is a perspective top and rear elevation view of the lower support base with the electronic components separated from the rear edge area therefrom.
Figure 7:
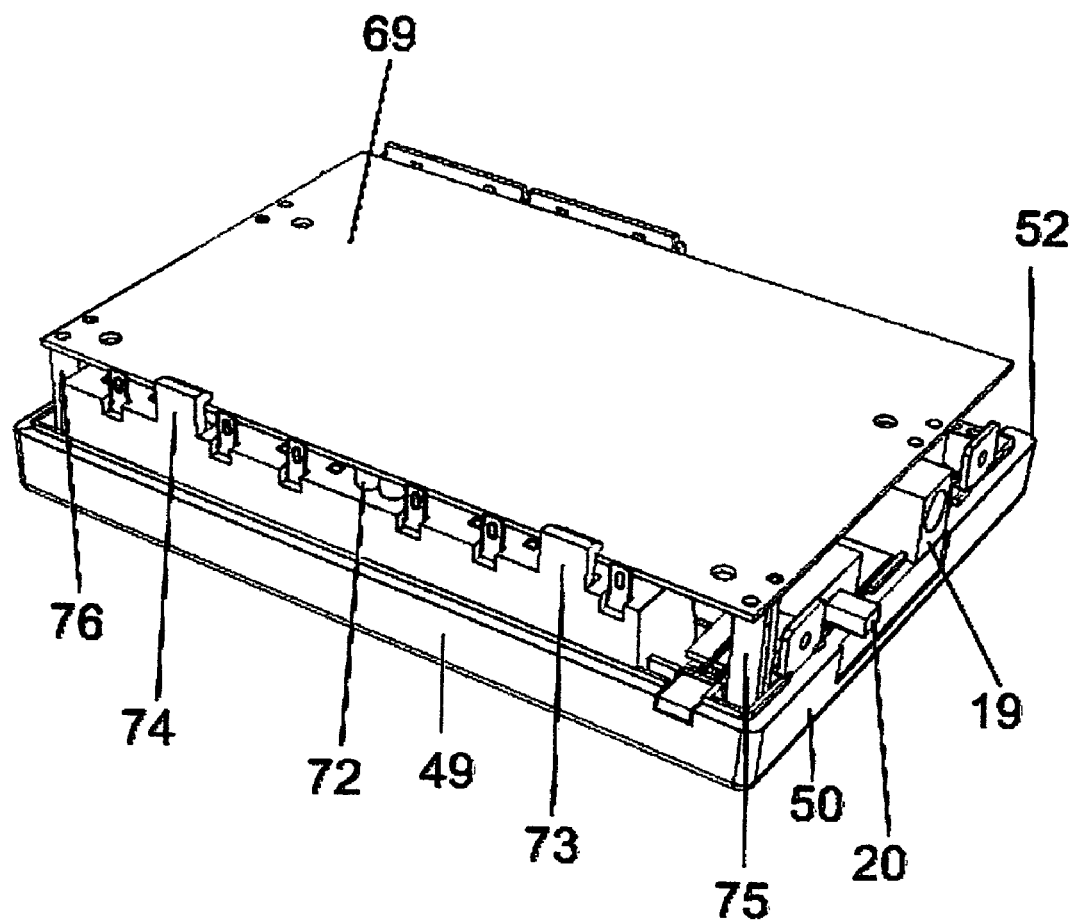
FIG. 7 is a perspective top and side elevation of the lower support base with the printed circuit board mounted thereon.
Figure 8:
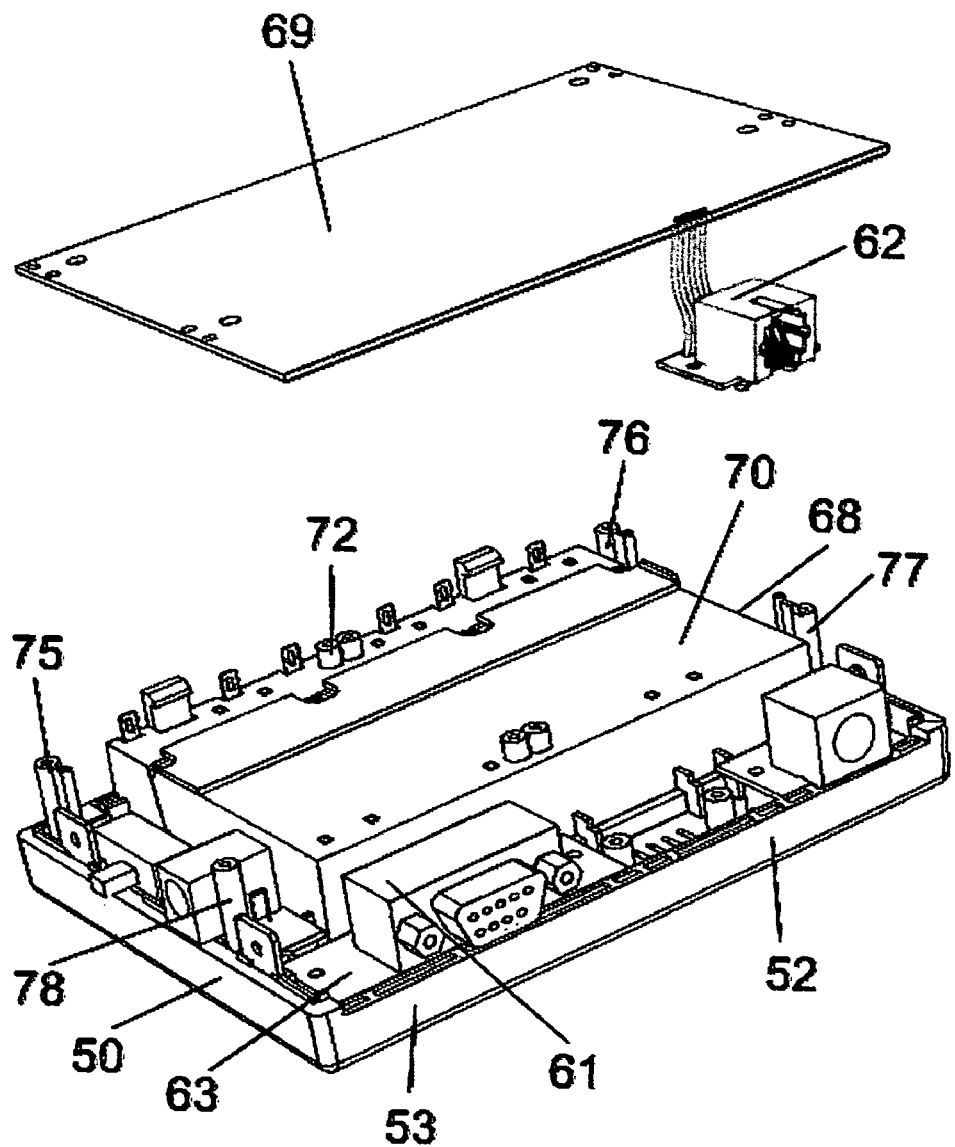
FIG. 8 is an exploded perspective top and rear elevation view with the printed circuit separated from the lower support base.
Figure 9:
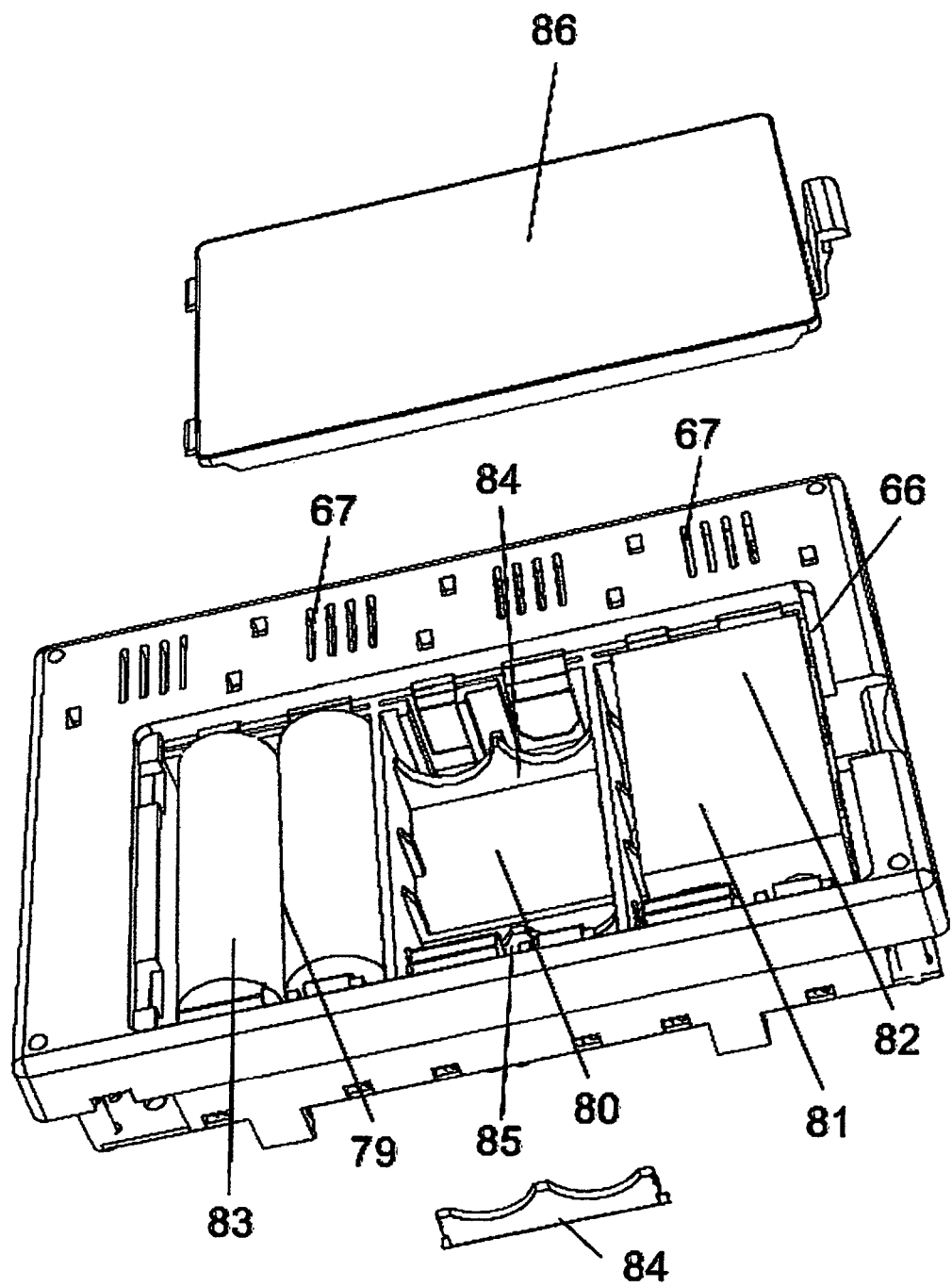
FIG. 9 is an exploded perspective bottom elevation view of the lower base support showing the battery compartments and the cover separated therefrom.
Figure 10:
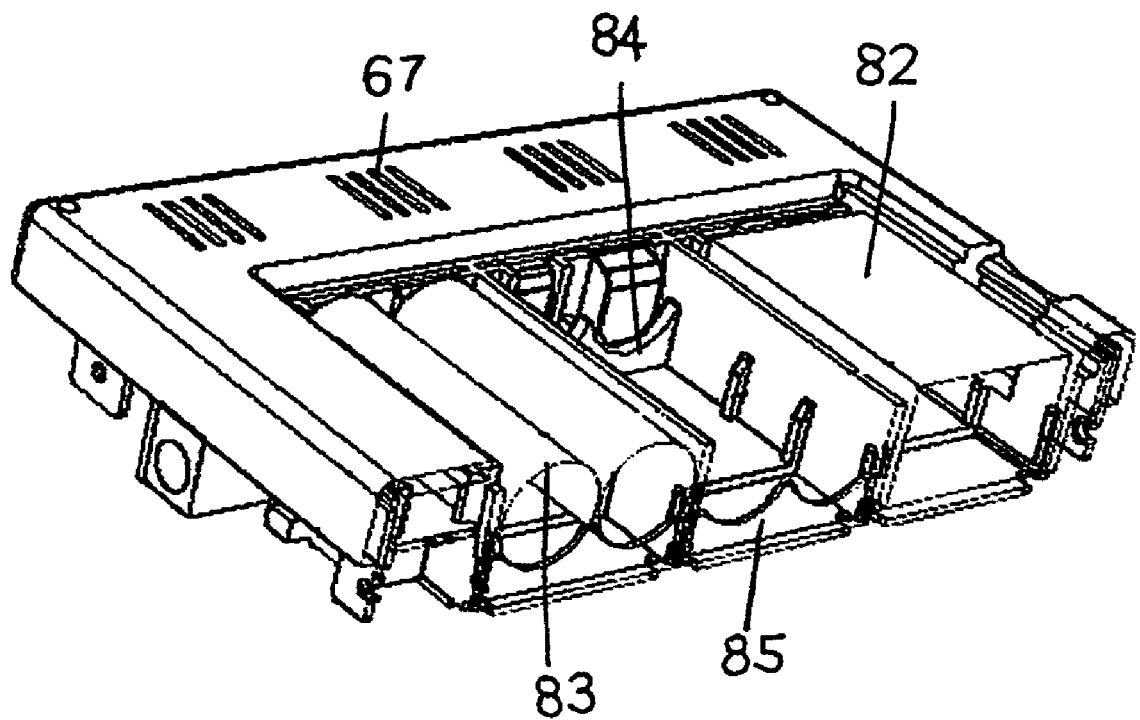
FIG. 10 is another exploded perspective bottom elevation view of the lower support base showing the construction of the battery compartments with various elements and batteries separated therefrom.

The lower support base 12 has upstanding side walls 49, 50, 51, and 52 engageable with the front wall 15, the two side walls 13 and 14 and the rear wall 52 of the top cover casing 11. A plurality of slot openings 53 and 54 are formed in the upper edge of the rear wall 52 as best shown in FIG. 5. The slot openings 53 are preferably shorter in length than that of the slot openings 54. A plurality of variable cover plates 55 are mountable to the rear of the enclosure 10. The variable cover plate 55 has two lower leg portions 56 and 57 extending downwards from the lower edge of its two side portions, and an upstanding elongated ridge 58 is formed at its upper edge. The dimensions of the two lower leg portions 56 and 57 are equal to the dimensions of the slot openings 53 formed at the upper edge of the rear wall 52 of the lower support base 12 and the distance between the lower leg portions 56 and 57 are equal to the distance between the adjacent slot openings 53 such that a cover plate 55 may be mounted to the upper edge of the rear wall 52 by slidably engaging the two lower leg portions 56 and 57 with the adjacent slot openings 53. The thickness and the height of the elongated ridge 58 of the cover plate 55 is equal to the width and depth of the groove 23 formed at the lower edge of the rear wall 16 of the top cover casing 11 such that the variable cover plate 55 will be mounted at the rear opening 21 and will be securely retained in place by the cooperation between the cover casing 11 and the lower support base 12 when the cover casing 11 and the lower support base 12 are mounted together. The flexible cover plate 55 is preferably made of a plastic material and has a plurality of vertical grooves 59 and horizontal grooves 60 formed in its inner wall such that the flexible cover may be severed along selected grooves to vary its width and/or height.

A plurality of electrical components such as a multi-port connector 61 and a communication network receptacle 62 may be located in the rear edge portion 52 of the lower support base 12. These electrical components are commonly provided with connection terminal pins having spacing of less than 0.1 inch pitch between the terminal pins which are often also provided in slanted rows so that it is problematic to make electrical connection to these terminal pins with the standard main printed circuit board located in the enclosure with the prototype circuit constructed on the main printed circuit board, because the terminal eyelets of the standard printed circuit board have a standard spacing of 0.1 inch. Furthermore, providing insulated push-on connectors to the terminal pins of the electrical components or to solder the leads directly thereon are also problematic. In order to obviate this problem, the electrical components are provided on adapter boards 63 and 64 with the electrical components pre-mounted on these adapter boards 63 and 64 which are provided with a pattern of eyelet connectors specifically laid out to match the configurations of the terminal pins of the particular electrical components, so that connections may be made and soldered to the adaptor boards. The connections are then routed to a row of soldering eyelets having the standard 0.1 inch spacing between neighboring eyelets provided on the adaptor boards. Thus, a ribbon cable or a row of header pins may be used with the adaptor boards 63 and 64 for easy connection to be made with the main printed circuit board. The adapter boards 63 and 64 may be conveniently secured in the edge area of the lower support base 12 by snap engagement with flexible inverted L-shaped posts 65 or alternatively secured to upstanding mounting posts 66 provided in the rear edge portion 63 of the lower support case 12. After the electrical components have been mounted to the enclosure 10, a plurality of variable cover plates 55 may be shaped by severing selected portions of these plates along selected vertical and horizontal grooves 59 and 60 formed in these plates so as to vary their shape and dimension to conform with the spacing and openings between and around the electrical components. Thus, the plates 55 may be mounted in the enclosure 10 for covering the spacing and openings between and around the electrical components. A plurality of ventilation slots 67 may be formed at the bottom panel of the rear edge portion 63 of the lower support casing 12.

A battery housing 68 is formed at the lower support casing 12. The main printed circuit board 69 with the prototype circuit constructed thereon may be mounted on the bottom surface 70 of the battery housing 68. A plurality of stand offs 71 and 72 are provided on the bottom surface 70 to space the printed circuit board 69 from the bottom surface 70. The printed circuit board 69 is held in position with inverted L-shaped tabs 73 and 74 formed at the edge portion of the bottom surface 70 of the battery housing 68 and may also be additionally secured in place with screws to mounting posts 75, 76, 77 and 78.

The battery housing 68 preferably has three compartments 79, 80 and 81 which have dimensions to accommodate a standard 9-volt battery 82 or two AA batteries 83. A generally W-shaped pivotal plate 84 is located adjacent one end of each compartment and a generally similar W-shaped pivotal plate 85 is located immediately adjacent to the other end of the compartment. These pivotal plates 84 and 85 may be turned upwards for supporting two AA batteries located in the compartment. Alternatively, the plate 85 may be non-pivotal and is fixed in place for simplicity in operation. A bottom cover plate 86 is provided for covering the bottom opening of the battery compartment.

A template may be accurately and neatly printed by utilizing a computer program to provide locations for forming openings in the protective cover sheets 34 and 35 to accommodate the operative element of electrical components, such as a rheostat for adjusting frequency, and slidable switch for varying the frequency setting and display, located on the printed circuit board within the enclosure. The openings may be neatly formed by cutting or stamping in the transparent protective cover sheets 34 and 35 with a hand tool. Markings may also be produced by computer on a paper label 87 safely sandwiched between the protective cover sheets 34 and 35.

While the preferred embodiments of the invention have been described above, it will be recognized and understood that various modifications may be made therein and the appended claims are intended to cover all such modifications which may fall within the spirit and scope of the invention.

What is claimed is:

1. An electronic prototyping enclosure comprising,
a generally rectangular lower support base having upstanding side walls, front wall and rear wall,
a border area located adjacent to said rear wall and adapted for locating a plurality of electrical components therein,
a rectangular top cover casing adapted for mounting on and covering over said rectangular lower support base, said top cover casing having an opened top with a surrounding border frame, and downward skirting side walls, one of said side walls adjacent to said first border area when said lower support base and top cover casing are mounted together, having a rectangular cut out formed in a lower edge portion therein,
a plurality of variable cover plates mountable at said cut out to cover space openings between and around said electrical components,
a plurality of mounting plates located in said lower support base and operative for securing said lower support base and said top covering casing together.

2. An electronic prototyping enclosure according to claim 1 including an elongated groove formed in a lower edge of said cut out of said top cover casing, and a plurality of mounting slots formed in a top edge of said rear wall of said lower support casing, said variable cover plates having leg portions engageable with said mounting slots and an upstanding ridge engageable with said elongated groove for fixedly securing between said top cover casing and said lower support base.

3. An electronic prototyping enclosure according to claim 2 wherein said variable cover plates have a plurality of vertical grooves and horizontal grooves formed in an inner surface therein, said variable cover plates being severable along selected vertical grooves and horizontal grooves to obtain a desired width and height for covering said space openings of various shapes and dimensions located between and around said electrical components.

4. An electronic prototyping enclosure according to claim 3 wherein said electrical components located in said border area adjacent to said rear wall of said lower support casing are pre-mounted on adaptor boards having a pattern of connection eyelets matching with the configurations of terminal pins of said electrical components, and said connection eyelets are electrical connected to a plurality of connection terminals on said adaptor boards having a terminal spacing compatible with standard spacing between eyelet terminals of a standard printed circuit board.

5. An electronic prototyping enclosure according to claim 4 including a plurality of ventilation slot openings formed in a bottom panel of said border area of said lower support casing.

6. An electronic prototyping enclosure according to claim 5 wherein said electrical components are mounted on separate mounting plates and said mounting plates are, in turn, mounted to support posts located in said first border area.

7. An electronic prototype enclosure according to claim 4 including a printed circuit board mountable on said lower support base and located below said opened top of said top cover casing, a composite transparent covering sheet member located in said open top of said top covering casing and lying juxtaposed to said surrounding border frame, said composite transparent covering sheet member including two transparent plastic sheets operative for sandwiching therebetween a template sheet having labeling and locations of openings to be formed in said covering sheet member for accommodating and displaying electrical components mounted on said printed circuit board.

8. An electronic prototyping enclosure according to claim 7 including a battery housing formed in said lower support base, a plurality of stand offs being formed on a bottom surface of said battery housing and operative for supporting said printed circuit board securely in a horizontal position.

9. An electronic prototyping enclosure according to claim 8 wherein said top cover casing, said lower support base and said plurality of variable cover plates are made of a plastic material.

10. An electronic prototyping enclosure according to claim 9 wherein said battery housing includes three compartments operative for housing batteries of various sizes.

11. An electronic prototyping enclosure according to claim 10 including a first generally W-shaped plate pivotally mounted adjacent to one end of each of said compartments, and a second generally W-shaped plate pivotally mounted adjacent a second end opposite to said one end, said first W-shaped plate and said second W-shaped plate being selectively pivotable between an upright position and a folded position to lie juxtapose to bottom panel of each compartment to facilitate mounting of batteries of various selected sizes in said compartments.

* * * * *